(12) United States Patent
Ishikawa

(10) Patent No.: US 8,299,845 B2
(45) Date of Patent: Oct. 30, 2012

(54) SEMICONDUCTOR DEVICE

(75) Inventor: Toru Ishikawa, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 50 days.

(21) Appl. No.: 12/880,730

(22) Filed: Sep. 13, 2010

(65) Prior Publication Data
US 2011/0063017 A1   Mar. 17, 2011

(30) Foreign Application Priority Data

Sep. 16, 2009  (JP) .................................. 2009-214508

(51) Int. Cl.
*H01H 37/76*   (2006.01)
(52) U.S. Cl. ........................................................ 327/525
(58) Field of Classification Search .................. 327/524, 327/525, 530, 534, 537
See application file for complete search history.

(56) References Cited

U.S. PATENT DOCUMENTS

| | | | | |
|---|---|---|---|---|
| 5,056,061 A * | 10/1991 | Akylas et al. | .................... | 365/96 |
| 5,834,970 A * | 11/1998 | Manning | ........................ | 327/567 |
| 7,482,854 B2 * | 1/2009 | Choi et al. | ..................... | 327/525 |
| 7,940,113 B2 * | 5/2011 | Kawagoshi | .................... | 327/525 |

FOREIGN PATENT DOCUMENTS

JP    2007-116045    5/2007

* cited by examiner

*Primary Examiner* — Jeffrey Zweizig
(74) *Attorney, Agent, or Firm* — Morrison & Foerster LLP

(57) ABSTRACT

A semiconductor device includes a first circuit, a second circuit, and a first voltage dividing circuit. The first circuit is coupled to a first terminal. The first circuit is operable by a first voltage supplied from the first terminal. The second circuit is coupled through a first resistive element to the first terminal. The second circuit is operable by a second voltage supplied through the first resistive element from the first terminal. The second voltage is smaller in absolute value than the first voltage. The first voltage dividing circuit is coupled to a first node between the first resistive element and the second circuit. The first voltage dividing circuit has a conductive state and a non-conductive state. The first voltage dividing circuit is kept in the conductive state while applying the first voltage to the first terminal to allow the first circuit to operate by the first voltage.

19 Claims, 6 Drawing Sheets

SEMICONDUCTOR DEVICE

BACKGROUND OF THE INVENTION

1. Field of the Invention

The present invention relates to a semiconductor device which is operated by using different voltages.

Priority is claimed on Japanese Patent Application First Publication, No. 2009-214508, filed Sep. 16, 2009, the content of which is incorporated herein by reference.

2. Description of the Related Art

In semiconductor devices, such as DRAMs (Dynamic Random Access Memories), non-volatile memory elements are used for replacing defective addresses for defective cells and for switching the internal operations. Some types of fuses, such as electrical fuses and laser fuses, are used as the non-volatile memory elements for the purpose described above. The electrical fuses can be programmed electrically, and the laser fuses can be programmed by cutting the fuses with a laser beam. Information stored in the non-volatile memory elements is read as read-out signals and the information is stored in a latch circuit.

For writing data (information) in the electrical fuses, a writing voltage required to write data is higher than the operation voltage of a semiconductor device. The semiconductor device includes external terminals so that the writing voltage can be applied to the fuses through the external terminals from outside the semiconductor device. The general terminals are used to apply the operation voltage to the internal circuits of the semiconductor device. The external terminals are arranged separately from the general terminals which are coupled to the internal circuits. This separation of the external and general terminals can avoid from the risk of applying the writing voltage to the internal circuits, so that the internal circuits are protected from breakdown.

For another example, a patent publication, Japanese Unexamined Patent Application, First Publication, No. 2007-116045 addresses a method which does not use the writing voltage through the external terminals. In the method, the writing voltage is generated within the semiconductor device.

SUMMARY

In one embodiment, a semiconductor device may include, but is not limited to, a first circuit, a second circuit, and a first voltage dividing circuit. The first circuit may be coupled to a first terminal. The first circuit may be operable by a first voltage supplied from the first terminal. The second circuit may be coupled through a first resistive element to the first terminal. The second circuit may be operable by a second voltage supplied through the first resistive element from the first terminal. The second voltage may be smaller in absolute value than the first voltage. The first voltage dividing circuit may be coupled to a first node between the first resistive element and the second circuit. The first voltage dividing circuit may have a conductive state and a non-conductive state. The first voltage dividing circuit may be kept in the conductive state while applying the first voltage to the first terminal to allow the first circuit to operate by the first voltage.

In another embodiment, a semiconductor device may include, but is not limited to, an external terminal, a non-volatile circuit, an internal circuit, a resistive element, and a voltage dividing circuit. The non-volatile circuit may be operable at a first voltage. The internal circuit may be operable at a second voltage that is smaller in absolute value than the first voltage. The resistive element may be between the external terminal and the internal circuit. The voltage dividing circuit may be coupled to a first node between the resistive element and the external terminal. The voltage dividing circuit has a conductive state and a non-conductive state. The voltage dividing circuit may be kept in the conductive state to cause the first node to be lower in potential than the external terminal during application of the first voltage to the external terminal to allow the non-volatile circuit to operate by the first voltage.

In still another embodiment, a semiconductor device may include, but is not limited to, a first circuit, a voltage drop circuit, and a second circuit. The first circuit may be coupled to a terminal. The first circuit may be operable by a first voltage supplied from the terminal. The voltage drop circuit may be coupled to the terminal. The voltage drop circuit may be configured to generate a second voltage while the first voltage being applied to the terminal to allow the first circuit to operate by the first voltage. The second voltage is smaller in absolute value than the first voltage. The second circuit may be coupled to the voltage drop circuit to receive the second voltage.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

Figure 1:
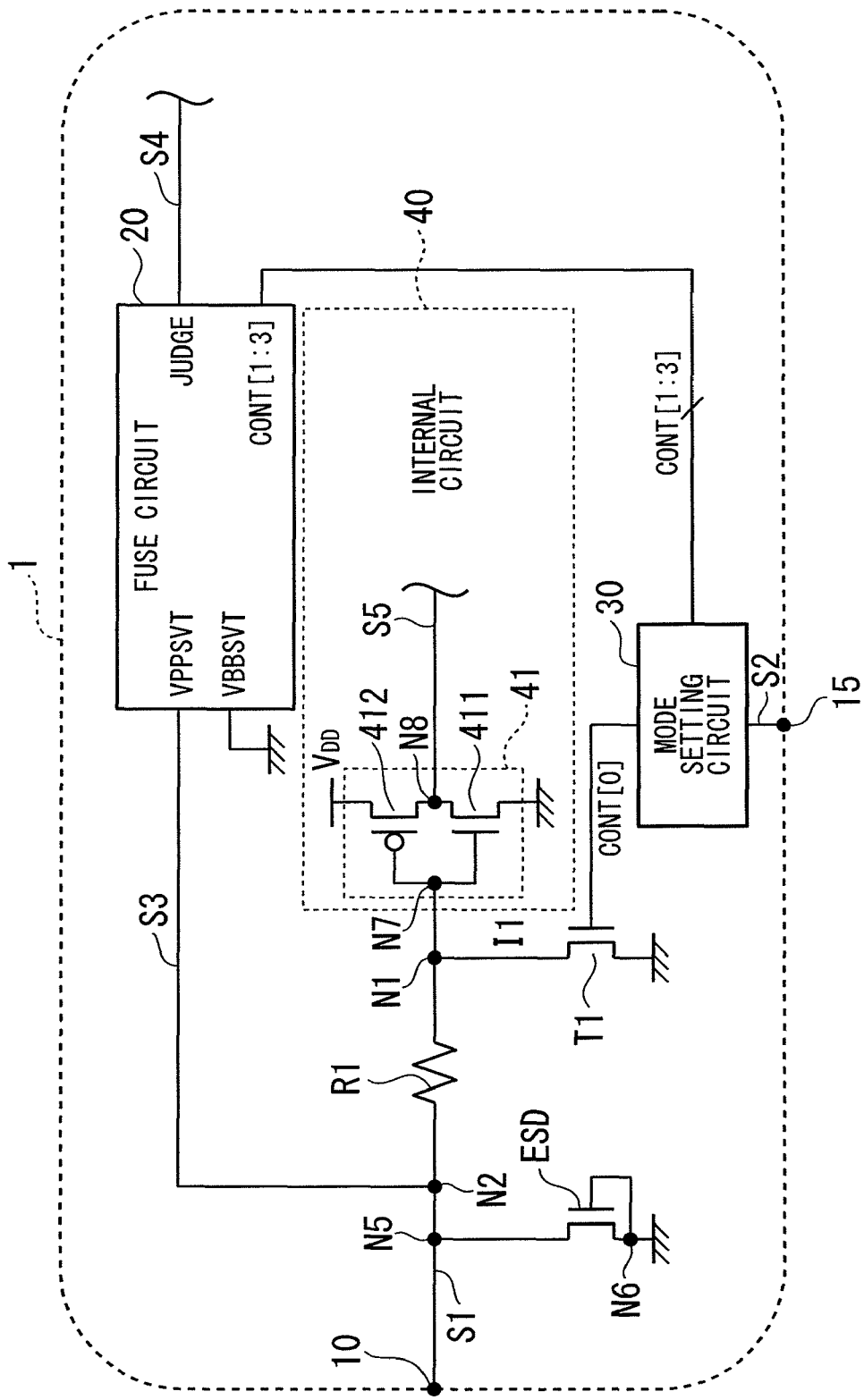
FIG. 1 is a diagram illustrating the configuration of a circuit for a semiconductor device in accordance with a first preferred embodiment of the present invention.

Before describing the present invention, the related art will be explained in detail, in order to facilitate the understanding of the present invention.

With reference to the patent publication, Japanese Unexamined Patent Application, First Publication, No. 2007-116045, the method described in the patent publication can not be applied to DRAMs or the like, because such devices include pins and pads which are placed at predetermined locations in the semiconductor device according to a specification. Thus, it is difficult to add additional terminals such as pins and pads to the device for applying a higher voltage to another circuit within the device, in which another circuit operates at higher voltage than the operation voltage of the internal circuit. For another method, unlike the method described in the patent application, when a booster converter is introduced in the semiconductor device to generate a voltage higher than the operation voltage without no additional pins and pads for storing data (writing information) to the electrical fuses, the semiconductor device needs to increase its chip area.

Embodiments of the invention will be now described herein with reference to illustrative embodiments. Those skilled in the art will recognize that many alternative embodiments can be accomplished using the teaching of the embodiments of the present invention and that the invention is not limited to the embodiments illustrated for explanatory purpose.

In one embodiment, a semiconductor device may include, but is not limited to, a first circuit, a second circuit, and a first voltage dividing circuit. The first circuit may be coupled to a first terminal. The first circuit may be operable by a first voltage supplied from the first terminal. The second circuit may be coupled through a first resistive element to the first terminal. The second circuit may be operable by a second voltage supplied through the first resistive element from the first terminal. The second voltage may be smaller in absolute value than the first voltage. The first voltage dividing circuit may be coupled to a first node between the first resistive element and the second circuit. The first voltage dividing circuit may have a conductive state and a non-conductive state. The first voltage dividing circuit may be kept in the conductive state while applying the first voltage to the first terminal to allow the first circuit to operate by the first voltage.

The first terminal performs as a common terminal to both the first and second circuits. The first voltage dividing circuit combined with the first resistive element may be configured to generate a lower voltage than the first voltage that is applied to the external terminal. The first voltage dividing circuit is not limited to any particular circuit configuration. In some cases, the first voltage dividing circuit may be realized by, a simple circuit configuration, in light of avoiding any substantive increase of the circuit area. The first voltage dividing circuit may be coupled to the resistive element. The resistive element may be coupled between the first terminal and the second circuit. The first voltage dividing circuit may be coupled between a fixed potential line and the first node. The first node is between the resistive element and the internal circuit. The fixed potential line provides a fixed potential. In some cases, the fixed potential line may be a ground line. The potential of the first node is lower than the potential of the first terminal while the first voltage dividing circuit is operating to flow a current through the resistive element. The first voltage dividing circuit may be configured by, but not limited to, a switching element that is coupled between the first node and the ground line. The switching element may be configured by any switching element that controls the current through the resistive element, or switches the current between ON and OFF. In some cases, the switching element may be realized by, but not limited to, a switching transistor such as a MOS transistor.

In some cases, the first voltage dividing circuit may be configured to receive a first control signal that switches the first voltage dividing circuit between the conductive state and a non-conductive state.

In some cases, the second circuit may include, but is not limited to, a first transistor having a first gate, the first gate is coupled to the first node.

In some cases, the second circuit may include, but is not limited to, a first CMOS circuit having a first input coupled to the first node.

In some cases, the semiconductor device may include, but is not limited to, a first capacitive element coupled to the first circuit. The first capacitive element is coupled to a second node that is between the first terminal and the first resistive element.

In some cases, the first capacitive element may include, but is not limited to, a MOS capacitor, the MOS capacitor increases capacitance when the first voltage is applied to the first terminal.

In some cases, the semiconductor device may include, but is not limited to, a first switching element coupled between the second node and the first capacitive element. The first switching element is kept in a conductive state while the first voltage is applied to the first terminal.

In some cases, the first circuit may include, but is not limited to, an electric fuse.

In some cases, the first circuit may include, but is not limited to, a memory circuit comprising an electric fuse and field effect transistors.

In some cases, the first voltage dividing circuit may include, but is not limited to, a field effect transistor coupled between the first node and a fixed-potential line.

In some cases, the first circuit may be coupled to a second terminal. The first circuit may be operable when a difference in potential between the first and second terminals is equal to the first voltage. The second circuit may be coupled through a second resistive element to the second terminal.

In some cases, the semiconductor device may include, but is not limited to, a second voltage dividing circuit coupled to a third node between the second resistive element and the second circuit. The second voltage dividing circuit is kept in a conductive state when the difference in potential between the first and second terminals is equal to the first voltage.

In some cases, the second voltage dividing circuit may be configured to receive a second control signal that switches the second voltage dividing circuit between the conductive state and a non-conductive state.

In some cases, the semiconductor device may include, but is not limited to, a mode setting circuit that supplies the first voltage dividing circuit with a first control signal that switches the first voltage dividing circuit between the conductive state and a non-conductive state.

In another embodiment, a semiconductor device may include, but is not limited to, an external terminal, a non-volatile circuit, an internal circuit, a resistive element, and a voltage dividing circuit. The non-volatile circuit may be operable at a first voltage. The internal circuit may be operable at a second voltage that is smaller in absolute value than the first voltage. The resistive element may be between the external terminal and the internal circuit. The voltage dividing circuit may be coupled to a first node between the resistive element and the external terminal. The voltage dividing circuit has a conductive state and a non-conductive state. The voltage dividing circuit may be kept in the conductive state to cause the first node to be lower in potential than the external terminal during application of the first voltage to the external terminal to allow the non-volatile circuit to operate by the first voltage.

The external terminal performs as a common terminal to both the non-volatile circuit and the internal circuit. The non-volatile circuit may be configured to receive a higher voltage that is applied to the external terminal. The resistive element coupled with the voltage dividing circuit may be configured to receive the higher voltage that is applied to the external terminal. The voltage dividing circuit coupled with the resistive element may be configured to generate a lower voltage than the higher voltage. The second circuit may be configured to receive the lower voltage that is generated by the voltage dividing circuit coupled with the resistive element.

The voltage dividing circuit coupled with the resistive element may be configured to generate a lower voltage than the higher voltage that is applied to the terminal. The voltage dividing circuit coupled with the resistive element is not limited to any particular circuit configuration. In some cases, the voltage dividing circuit coupled with the resistive element may be realized by, a simple circuit configuration, in light of avoiding any substantive increase of the circuit area. The resistive element may be coupled between the external terminal and the internal circuit. The voltage dividing circuit may be coupled between a fixed potential line and a node. The first node is between the resistive element and the internal circuit. The fixed potential line provides a fixed potential. In some cases, the fixed potential line may be a ground line. The potential of the first node is lower than the potential of the external terminal while the voltage dividing circuit is operating to flow a current through the resistive element. The voltage dividing circuit may be configured by, but not limited to, a switching element that is coupled between the first node and the ground line. The switching element may be configured by any switching element that controls the current through the resistive element, or switches the current between ON and OFF. In some cases, the switching element may be realized by, but not limited to, a switching transistor such as a MOS transistor.

In some cases, the voltage dividing circuit may be configured to receive a control signal that switches the voltage dividing circuit between the conductive state and a non-conductive state.

In some cases, the voltage dividing circuit may include, but is not limited to, a switching transistor coupled between the first node and a fixed-potential line.

In still another embodiment, a semiconductor device may include, but is not limited to, a first circuit, a voltage drop circuit, and a second circuit. The first circuit may be coupled to a terminal. The first circuit may be operable by a first voltage supplied from the terminal. The voltage drop circuit may be coupled to the terminal. The voltage drop circuit may be configured to generate a second voltage while the first voltage being applied to the terminal to allow the first circuit to operate by the first voltage. The second voltage is smaller in absolute value than the first voltage. The second circuit may be coupled to the voltage drop circuit to receive the second voltage.

The semiconductor device may include, but is not limited to, an external terminal, first and second circuits, and a voltage drop circuit. The first circuit may be coupled to the terminal. The voltage drop circuit may be coupled to the external terminal. The internal circuit may be coupled through the voltage drop circuit to the terminal. The terminal performs as a common terminal to both the first and second circuits. The first circuit may be configured to receive a higher voltage that is applied to the terminal. The voltage drop circuit may be configured to receive the higher voltage that is applied to the external terminal. The voltage drop circuit may be configured to generate a lower voltage than the higher voltage. The second circuit may be configured to receive the lower voltage that is generated by the voltage drop circuit.

The voltage drop circuit may be configured to generate a lower voltage than the higher voltage that is applied to the external terminal. The voltage drop circuit is not limited to any particular circuit configuration. In some cases, the voltage drop circuit may be realized by, a simple circuit configuration, in light of avoiding any substantive increase of the circuit area. The voltage drop circuit may be configured by a resistive element and a voltage dividing circuit coupled to the resistive element. The resistive element may be coupled between the terminal and the second circuit. The voltage dividing circuit may be coupled between a fixed potential line and a first node. The first node is between the resistive element and the internal circuit. The fixed potential line provides a fixed potential. In some cases, the fixed potential line may be a ground line. The potential of the first node is lower than the potential of the external terminal while the voltage dividing circuit is operating to flow a current through the resistive element. The voltage dividing circuit may be configured by, but not limited to, a switching element that is coupled between the first node and the ground line. The switching element may be configured by any switching element that controls the current through the resistive element, or switches the current between ON and OFF. In some cases, the switching element may be realized by, but not limited to, a switching transistor such as a MOS transistor.

In some cases, the voltage drop circuit may include, but is not limited to, a resistive element coupled to the terminal, and a switch coupled between a fixed-potential line and a node between the resistive element and the second circuit.

In some cases, the semiconductor device may include, but is not limited to, a control circuit that places the switch in a conductive state to cause a current through the resistive element.

First Embodiment

In one embodiment, FIG. 1 is a diagram illustrating the configuration of a circuit for a semiconductor device 1 in accordance with a first embodiment of the present invention. The semiconductor device 1 includes an external terminal 10, an external mode terminal 15, a fuse circuit 20 (or a first circuit), a mode setting circuit 30, an internal circuit 40 (or a second circuit), and a protection element ESD, a resistive element R1, and a voltage divider T1.

The fuse circuit 20 includes a positive voltage terminal VPPSVT, a negative voltage terminal VBBSVT, an output terminal JUDGE, and a control signal terminal CONT [1:3]. The positive voltage terminal VPPSVT is connected to the external terminal 10 at a node N2 and receives a signal S1 having a first voltage (equivalent to S3) from the external terminal 10. The negative voltage terminal VBBSVT is connected to ground. The control signal terminal CONT [1:3] receives control signals CONT [1:3] from the mode setting circuit 30, and the output terminal JUDGE transmits a signal S4 of information stored in the fuse circuit 20.

Further, the fuse circuit 20 performs an operation of writing data, when a potential difference, for example, 6V is applied between the positive voltage terminal VPPSVT and the negative voltage terminal VBBSVT. For the semiconductor device 1, the negative voltage terminal VBBSVT is connected to ground, so that data are written by applying voltage to the positive voltage terminal VPPSVT. For writing data (information) in the fuse circuit 20, a high level voltage (a first voltage) can be applied, in which the high level voltage is higher than a supply voltage (a second voltage) which is applied to the internal circuit 40, and the high level voltage is higher than the breakdown voltage of transistors included in the internal circuit 40.

The mode setting circuit 30 receives a signal S2 from the external mode terminal 15. The signal S2 indicates to select one of three types of operations for controlling the voltage divider T1 and the fuse circuit 20. The mode setting circuit 30 transmits one of the three control signals CONT [0:3] which corresponds to one of the three operations indicated by the signal S2. The signal received from the external mode terminal 15 indicates the following operations: To write data in the fuse circuit 20; to read out data from the fuse circuit 20; and to drive the internal circuit 40.

The mode setting circuit 30 transmits a control signal CONT [0] to the voltage divider T1 to switch a state of the voltage divider T1 between ON and OFF, and transmits control signals CONT [1:3] to the fuse circuit 20 for controlling a mode of the operations of the fuse circuit 20 between writing and reading.

The internal circuit 40 operates with a supply voltage, for example, at 1.5V, and includes a first step circuit 41 which receives the signal S1 having the first voltage from the external terminal 10 through the resistive element R1. The first step circuit 41 includes an N-channel metal oxide semiconductor transistor 411 (hereafter, N-channel MOS transistor 411) and a P-channel MOS transistor 412. The N-channel MOS transistor 411 and the P-channel MOS transistor 412 forms a CMOS circuit. The supply voltage is applied to the source of the P-channel MOS transistor 412, and the drain of the P-channel MOS transistor 412 is coupled to the drain of the N-channel MOS transistor 411 at a node N8. The gates of the N-channel MOS transistor 411 and the P-channel MOS transistor 412 are connected at a node N7 which is connected to one side of the resistive element R1 at the node N1. The source of the N-channel MOS transistor 411 is connected to ground. The first step circuit 41 transmits signals to a succeeding circuit of the first step circuit 41 from the node N8.

The protection element ESD may include an N-channel MOS transistor, in which the source and the gate of the N-channel MOS transistor are coupled at a node N6 and connected to ground. The drain of the N-channel MOS transistor is connected to a node N5 on a wiring which connects the external terminal 10 and one end of the resistive element R1 through the node N2 (second node). The other end of the resistive element R1 is connected to the external terminal 10 through the nodes N2 and N5, and the one end of the resistive element R1 is connected to the internal circuit 40 through the node N1 (first node).

The voltage divider T1 may include an N-channel MOS transistor, in which the drain of the N-channel MOS transistor is connected to the node N1 at which the resistive element R1 and the internal circuit 40 are connected. The source of the N-channel MOS transistor is connected to ground, and the gate of the N-channel MOS transistor receives the control signal CONT [0] from the mode setting circuit 30.

Figure 2:
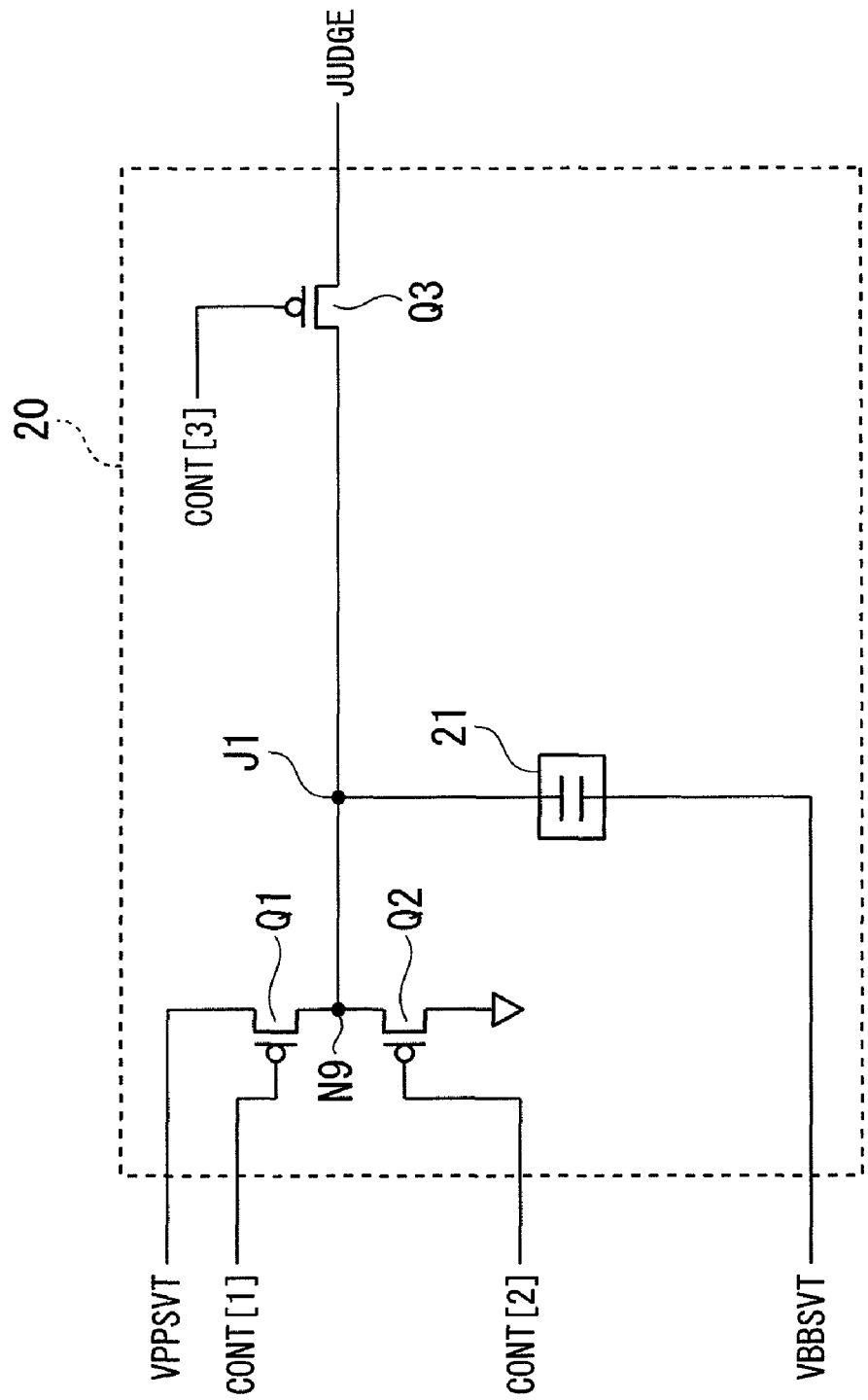
FIG. 2 is a diagram illustrating the configuration of an electrical fuse circuit for the semiconductor device in accordance with the first preferred embodiment of the present invention.

FIG. 2 is a diagram illustrating the configuration of an electrical fuse circuit for the semiconductor device in accordance with the first preferred embodiment of the present invention. As shown in figure, the fuse circuit 20 includes a P-channel MOS transistors Q1, Q2, and Q3, and an electrical fuse 21. The source of the P-channel MOS transistor Q1 is connected to the positive voltage terminal VPPSVT, the drain of the P-channel MOS transistor Q1 is connected to the source of the P-channel transistor Q2 at a node N9. The gate of the P-channel MOS transistor Q1 is connected to a line which receives a control signal CONT [1] from the mode setting circuit 30. The drain of the P-channel MOS transistor Q2 is connected to ground, and the gate of the transistor Q2 is connected to a line which receives a control signal CONT [2] from the mode setting circuit 30. The gate of the transistor Q3 is connected to a line which receives a control signal CONT [3] from the mode setting circuit 30.

One end of the electrical fuse 21 is connected to the drain of the P-channel MOS transistor Q1, the source of the P-channel transistor Q2 and the drain of the P-channel MOS transistor Q3 through a junction J1. The other end of the electrical fuse 21 is connected to the negative voltage terminal VBBSVT. The electrical fuse 21 stores data corresponding to either a bit data "1" or "0" because an irreversible change occurs to the fuse 21 when applied the high level voltage.

For example, when the electrical fuse 21 is a MOS transistor type fuse which may include an N-channel MOS transistor, the drain and gate of the N-channel MOS transistor is connected to the negative voltage terminal VBBSVT. Further the gate of the N-channel MOS transistor is connected to the junction J1, so that the gate oxide layer of the N-channel MOS transistor performs as a dielectric layer of a capacitance. When the high level voltage is applied to the electrical fuse 21, high electric fields are formed between the gate and the source and between the gate and the drain. The high electric field causes leak current flowing through the oxide layer of the N-channel MOS transistor. The leak current increases with increase of the applied voltage. Further increase of the voltage applied to the source and drain of the N-channel MOS transistor will cause the breakdown. The breakdown of the gate oxide layer is caused, and further current paths are formed in the gate oxide layer, so that the resistance of the electrical fuse 21 decreases from an insulating state showing an extremely high resistance, being equivalent to an insulator, to a conductive state showing a lower resistance ranging between several hundred kilo ohms and several hundred ohms. Thus, the electrical fuse 21 can take two states corresponding to an insulating state and a conductive state. This makes it possible for the electrical fuse 21 to be used as a memory element which can store information. Further, the fuse circuit 20 may include, but not limited to, a memory circuit including an electrical fuse and field effect transistors.

Now, the operation of the semiconductor device 1 is described below according to the present embodiment.

[Write Mode]

This mode is used to write data in the fuse circuit 20. If the mode setting circuit 30 receives, from the external mode terminal 15, the signal S2 indicating an operation for writing data into the fuse circuit 20, then the mode setting circuit 30 transmits signals which respectively correspond to a signal CONT [0] indicating an H (High) level control signal, a signal CONT [1] indicating L (low) level control signal, a signal CONT [2] indicating an H level signal, and a signal CONT [3] indicating an H level signal. Further, control signals CONT [0:3] indicate a combination of the signal levels in order of CONT [0], CONT [1], CONT [2], and CONT [3], which can be described as signals CONT [0:3]=(H, L, H, H). The signal level H corresponds to the supply voltage, and the signal level L corresponds to ground voltage.

When the control signals CONT [0:3] is transmitted to the voltage divider T1, the P-channel MOS transistors Q1, Q2, and Q3, the voltage divider T1 and the P-channel MOS transistor Q1 become a conductive state, and the P-channel MOS transistors Q2 and Q3 become a non-conducting state. See FIG. 1 and FIG. 2. Now, by applying a high level voltage signal S1 to the external terminal 10, the fuse circuit 20 can be operated. Specifically speaking, breakdown occurs in the gate oxide of the electrical fuse 21, which provides an irreversible change to the gate oxide, so that data can be stored.

Now assuming that a voltage V1 applied to the external terminal 10 as the signal S1, a voltage V2 to be applied to the first step circuit 41 through the node N1 can be expressed by a current I1 flowing through the voltage divider T1 and a resistance r1 of the resistive element R1 as follows:

$$V2 = V1 - r1 \times I1 \tag{1}$$

The voltage V2 can be designed to be smaller than the breakdown voltage of the MOS transistors 411 and 412 of the first step circuit 41 by choosing a proper resistive element R1 having an appropriate resistance r1. This allows the semiconductor device 1 to apply the high level voltage signal S1, which is higher than the breakdown voltage of the first step circuit 41, to the external terminal 10 without damaging the first step circuit 41 of the internal circuit 40.

For example, when 6 V is required for the high level voltage to write data in the fuse circuit 20 while the breakdown voltage of the N-channel MOS transistor 411 and the P-channel MOS transistor 412 is 2 V, the voltages to be applied to the gates of the MOS transistors 411 and 412 can be reduced to lower than 2 V by the voltage drop due to the resistive element R1 even if 6 V is applied to the external terminal 10 as the signal S1.

[Read Out Mode]

This mode is used to read data out from the fuse circuit 20.

When the mode setting circuit 30 receives, from the external mode terminal 15, a signal S2 which indicates to read out data stored in the fuse circuit 20, the mode setting circuit 30 transmits control signals CONT [0:3]=(−, L, H, L). In this case, the signal level of the control signal COTN [0] may take either H level or L level.

The mode setting circuit 30 can be set the control signals CONT [0:3] as default values for starting the read mode after the semiconductor device starts operating. That is, when the power is supplied to the semiconductor device 1, the mode setting circuit 30 transmits the control signals CONT [0:3] for starting the read mode without waiting for receiving the signal S2 from the external mode terminal 15. In this case, the mode setting circuit 30 transmits the control signals CONT [0:3] of the write mode by switching with control signals CONT [0:3] of a normal mode in response the signal S2 received from the external mode terminal 15.

Thereby, the P-channel MOS transistors Q1 and Q3 become the conductive state, and the P-channel MOS transistor Q2 becomes the non-conductive state.

In this case, if the supply voltage required for the internal circuit 40 is applied to the external terminal 10, the voltage at the terminal of the electrical fuse 21, which is connected to the junction J1, is pre-charged at the supply voltage. As the P-channel MOS transistor Q3 is under the conductive state, the voltage of the external terminal JUDGE corresponds to the voltage at the junction J1.

After the voltage of the junction J1 is pre-charged to the supply voltage, the mode setting circuit 30 changes the control signal CONT [1] from L level to H level, and stops supplying charges. If the electrical fuse 21 maintains the resistance high enough being nearly equivalent to the insulating state, the voltage of the external terminal JUDGE does not decrease even after a predetermined period of time passed, so that the pre-charged voltage is sustained at the supply voltage. On the other hand, the electrical fuse 21 is in the conductive state, the voltage of the junction J1 decreases with time and proportionally to the resistance of the electrical fuse 21.

Thus, the information stored in the fuse circuit 20 can be read by detecting if the voltage of the external terminal JUDGE maintains the pre-charged level or not after passing a predetermined time since the control signal CONT [1] has started changing to H level from L level.

[Normal Mode]

This mode is used to operate the internal circuit 40.

When the mode setting circuit 30 receives, from the external mode terminal 15, a signal S2 which indicates to perform the operation of the internal circuit 40, the mode setting circuit 30 transmits control signals CONT [0:3]=(L, H, −, −). In this case, the signal level of the control signals COTN [2] and CONT [3] may take either H level or L level. The voltage divider T1 becomes a non-conductive state. Thereby, a signal S1 with a signal level being input through the external terminal 10 can be received by the internal circuit 40 with mostly maintaining the signal level.

The mode setting circuit 30 can be set the control signals CONT [0:3] as default values for setting the normal mode after completing the read mode. That is, after the read mode is completed, the mode setting circuit 30 transmits the control signals CONT [0:3] for setting the normal mode without waiting for receiving the signal S2 from the external mode terminal 15.

As described above, the voltage divider T1 is set to the conducting mode with the control signal CONT [0] when data is written in the fuse circuit 20 by applying the high level voltage to the external terminal 10. Thereby, the voltage to be applied to the first step circuit 41 of the internal circuit 40 drops with the resistive element R1 and the voltage divider T1 as expressed by the equation (1), so that the voltage to be applied to the first step circuit 41 becomes lower than that to be applied to the external terminal 10. Thus, as the resistance r1 of the resistive element R1 and the current I1 flowing through the voltage divider T1 can be appropriately chosen according to the high level voltage V1 which is applied to the external terminal 10, a voltage required to write data to the fuse circuit 20 can be applied below the breakdown voltage of the N-channel and P-channel MOS transistors 411 and 412.

Further, it becomes possible that the voltage to be applied to the internal circuit 40 is set to be less than the individual breakdown voltages of the N-channel and P-channel MOS transistors 411 and 412 of the first step circuit 41, and the external terminal 10 can be commonly used for the signals to be received by the fuse circuit 20 and the internal circuit 40. As additional external terminals are not necessary for only use of the fuse circuit 20, the semiconductor device 1 can avoid from increase in the device area. Further, as a high level voltage can be applied to the fuse circuit 20 from the external terminal for writing data, it is not necessary for the semiconductor device 1 to include an additional booster converter within the semiconductor device 1. This allows the simple design of the semiconductor device 1 with avoiding increase in its device area.

Further, it is designed that the signal S1 applied to the external terminal 10 is received by the gates of the N-channel and P-channel MOS transistors 411 and 412 of the first step circuit 41 in the internal circuit 40. Thereby, the signal S1 received by the first step circuit 41 cannot be transmitted to succeeding circuits of the first step circuit 41, so that the internal circuit 40 can be protected from damages by properly designing the breakdown voltages of the N-channel and P-channel MOS transistors 411 and 412.

In the present embodiment, although an inverter circuit is used as the first step circuit 41, the present invention is not limited to it. As long as the circuit receives the signal S1 applied to the external terminal 10 with the gate of a transistor of the circuit for preventing direct transmission of the signal S1 through the internal circuit 40, the circuit may be, but is not limited to, a buffer circuit.

In accordance with a semiconductor device of the present embodiment, the semiconductor device includes a first circuit operating at a first voltage and a second circuit operating at a second voltage, in which the first voltage is higher than the second voltage. When the first voltage is applied to an external terminal of the semiconductor device, a voltage divider element (or device) is turned on, and divides the first voltage into a lower voltage with a resistive element and dividing elements, so that the lowered voltage is applied to the second circuit. In this case, the lowered voltage can be designed to be lower than the breakdown voltage of the second circuit by properly choosing the resistance of the resistive element. As a result, the second circuit can be protected from damage even if the first voltage is applied to the external terminal, and the external terminal can be commonly used for the first and second circuits. Thus, it is possible that the semiconductor device does not need to add a booster converter within the semiconductor device for writing data in a fuse circuit with commonly using the external terminal for the first and second circuits.

Second Embodiment

Figure 3:
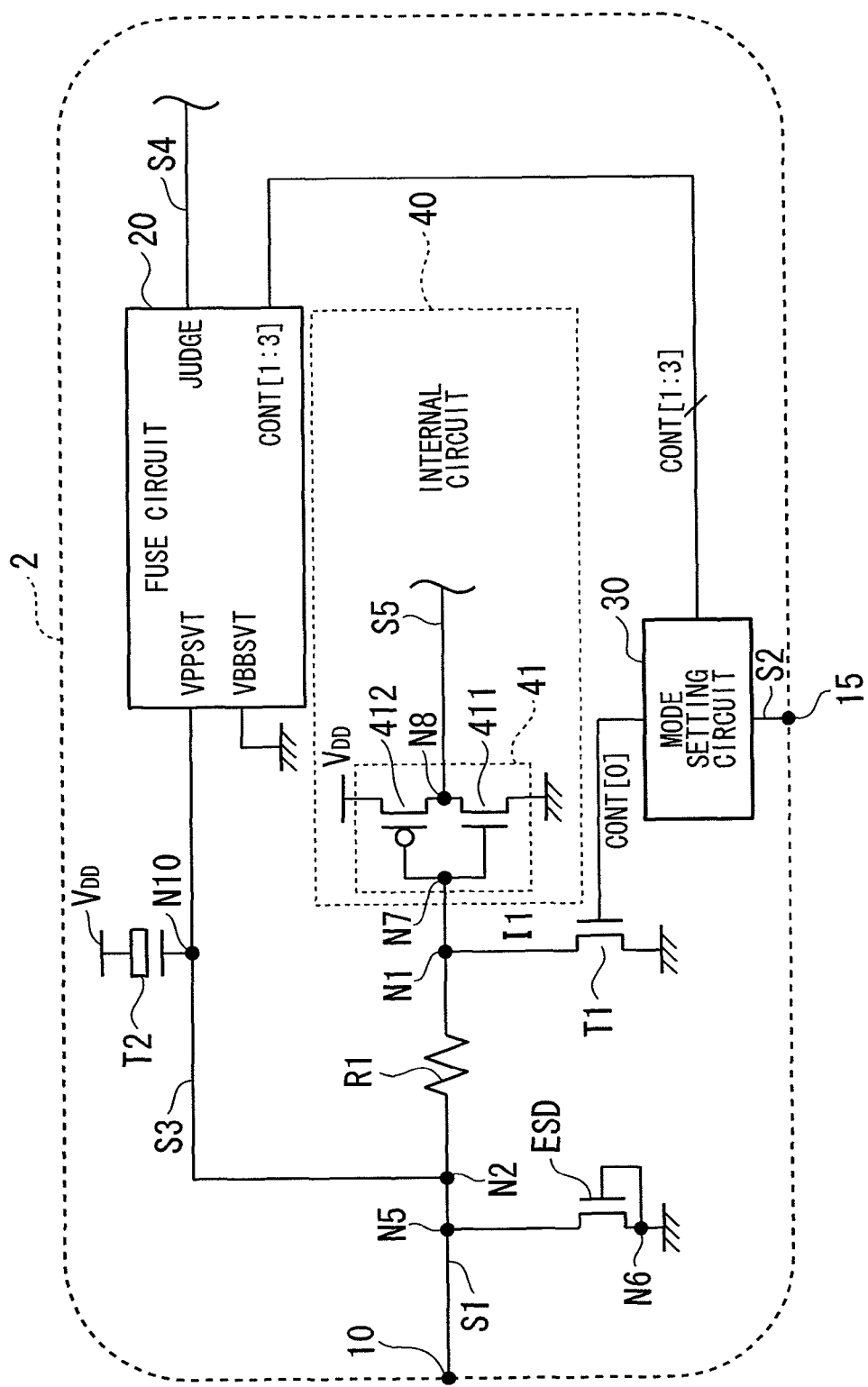
FIG. 3 is a diagram illustrating the configuration of a circuit for a semiconductor device in accordance with a second preferred embodiment of the present invention.

FIG. 3 is a diagram illustrating the configuration of a circuit for a semiconductor device 2 in accordance with a second preferred embodiment of the present invention. The semiconductor device 2 is another example which modifies the semiconductor device 1 of the first embodiment shown in FIG. 1. The semiconductor device 2 further includes an adjustment capacitor T2 between an external terminal 10 and a fuse circuit 20, unlike the case of the semiconductor device 1 of the first embodiment. Since the remaining parts of the semiconductor device 2 except the adjustment capacitor T2 are the same as those of the semiconductor device 1 of the first embodiment, the remaining parts corresponding to those of the semiconductor device 1 are indicated by the same symbols (10, 15, 20, 30, 40, 41, 411, 412, ESD, R1, T1, etc.) and the explanations about those parts are omitted.

The adjustment capacitor T2 may include an N-channel MOS transistor. For the N-channel MOS transistor, the source and the drain are coupled each other, and a supply voltage is applied individually to the source and drain. The gate of the N-channel MOS transistor is connected to a positive voltage terminal VPPSVT of a fuse circuit 20 via a node N10 and connected to the external terminal 10 via the node N10 and a node N2. The node N2 is positioned between the external terminal 10 and a resistive element R1.

For example, for operating an internal circuit 40 at a normal mode, a signal S1 with a signal level either a level H and a level L is received from the external terminal 10. When assuming that the difference between the signal levels H and L is 1.5 V, a supply voltage of the semiconductor device 2 is 1.5 V, and the signal S1 at 6 V is received via the external terminal 10 to write data in the fuse circuit 20, then the operation of the semiconductor device 2 is described as follows.

On the normal mode, since the signal level of the signal S1 is between 0 V and 1.5 V, the N-channel MOS transistor of the adjustment capacitor T2 becomes an OFF state, and the capacitance of the adjustment capacitor T2 is decreased. This results in decrease in a load capacitance of the external terminal 10, and reduces influence against the operation of the internal circuit 40. When the signal S1 at 6 V is applied to the external terminal 10 to write data in the fuse circuit 20, the N-channel MOS transistor of the adjustment capacitor T2 becomes an ON state and its capacitance is increased, so that the adjustment capacitor T2 operates as an adjustment capacitor.

By adding the adjustment capacitor T2, the semiconductor device 2 can reduce a sudden increase of voltage to be applied to an electrical fuse 21 of the fuse circuit 20 when writing data, so that a stable writing operation can be performed. Further, the current flowing through the P-channel MOS transistor Q1 can be gradually increased and protected from damages.

The capacitance of the adjustment capacitor T2 can be adjusted by adjusting the area of the gate of the N-channel MOS transistor, since the capacitance proportionally increases with the area of the gate of the N-channel MOS transistor.

Third Embodiment

Figure 4:
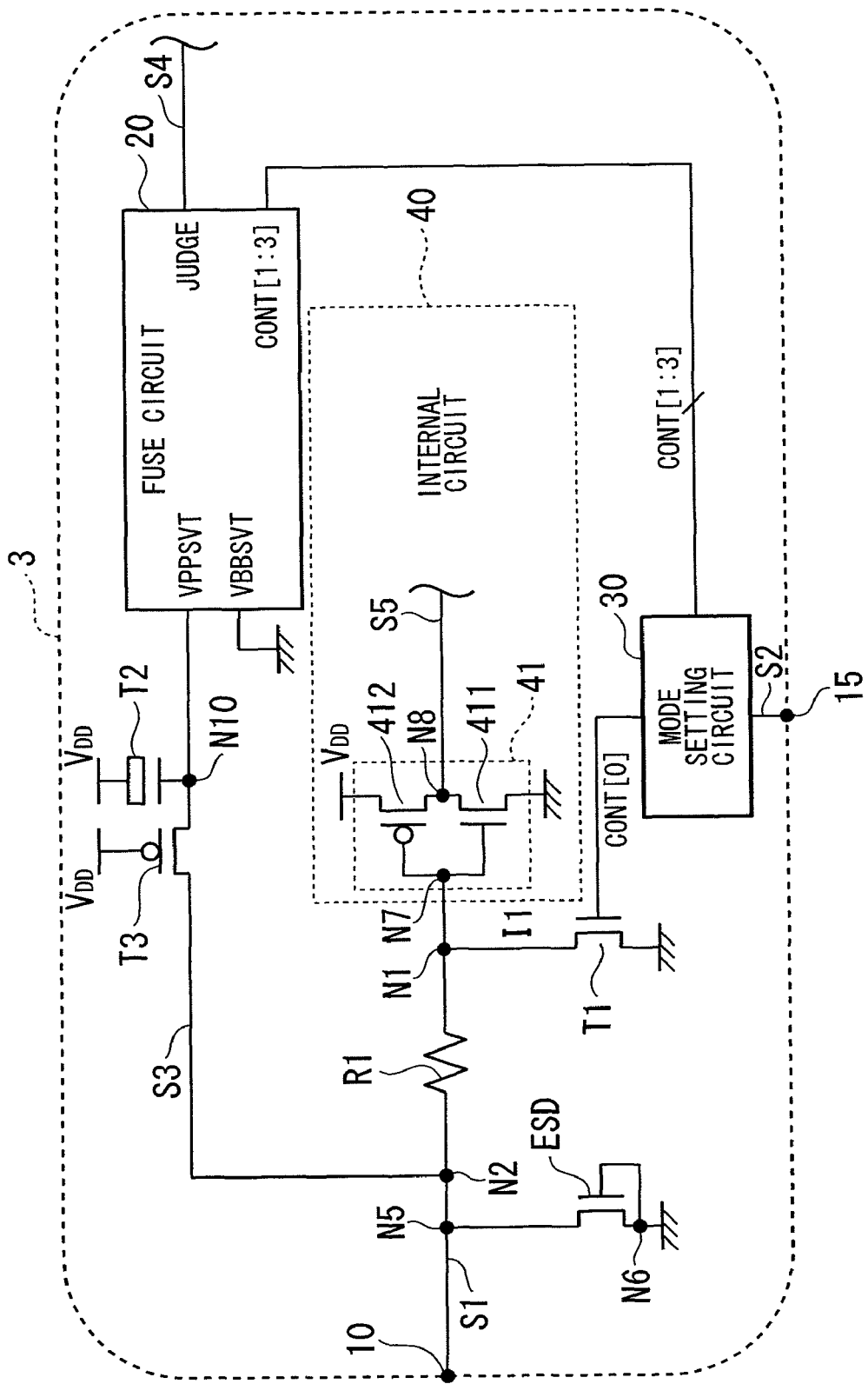
FIG. 4 is a diagram illustrating the configuration of a circuit for a semiconductor device in accordance with a third preferred embodiment of the present invention.

FIG. 4 is a diagram illustrating the configuration of a circuit for a semiconductor device 3 in accordance with a third preferred embodiment of the present invention. The semiconductor device 3 is another example which modifies the semiconductor device 2 of the second embodiment shown in FIG. 3. The semiconductor device 3 further includes a switching element T3 between an adjustment capacitor T2 and an external terminal 10, unlike the case of the semiconductor device 2 of the second embodiment. Since the remaining parts of the semiconductor device 3 except the switching element T3 are the same as those of the semiconductor device 2 of the second embodiment, the remaining parts corresponding to those of the semiconductor device 2 are indicated by the same symbols (10, 15, 20, 30, 40, 41, 411, 412, ESD, R1, T1, T2, etc.) and the explanations about those parts are omitted.

The switching element T3 may include a P-channel MOS transistor. For the P-channel MOS transistor, a supply voltage is applied to the gate of the P-channel MOS transistor. The drain is connected to one end of a resistive element R1 via a node N2, and the source is connected to the gate of the N-channel MOS transistor of the adjustment capacitor T2 and a positive voltage terminal VPPSVT of a fuse circuit 20 via a node N10.

For example, for operating an internal circuit 40 at a normal mode, a signal S1 with a signal level either a level H and a level L is received from the external terminal 10. When assuming that the difference between the signal levels H and L is 1.5 V, a supply voltage of the semiconductor device 3 is 1.5 V, and the signal S1 at 6 V is received via the external terminal 10 to write data in the fuse circuit 20, then the operation of the semiconductor device 3 is described as follows.

On the normal mode for operating the internal circuit 40, since the signal level of the signal S1 is between 0 V and 1.5 V, the P-channel MOS transistor of the switching element T3 becomes an OFF state, and the capacitance of the adjustment capacitor T2 and the capacitance included in the fuse circuit 20 are separated from the external terminal 10. This results in decrease in a load capacitance of the external terminal 10, and reduces influence against the operation of the internal circuit 40.

When the signal S1 at 6 V is applied to the external terminal 10 to write data in the fuse circuit 20, the P-channel MOS transistor of the switching element T3 becomes an ON state, and the adjustment capacitor T2 and the fuse circuit 20 are conducted, so that data can be written in the fuse circuit 20.

Alternatively, for the semiconductor device 3 of the present embodiment, the adjustment capacitor T2 may not be provided, instead, only the capacitance of the fuse circuit 20 may be separated from the external terminal 10 with the switching element T3.

Fourth Embodiment

Figure 5:
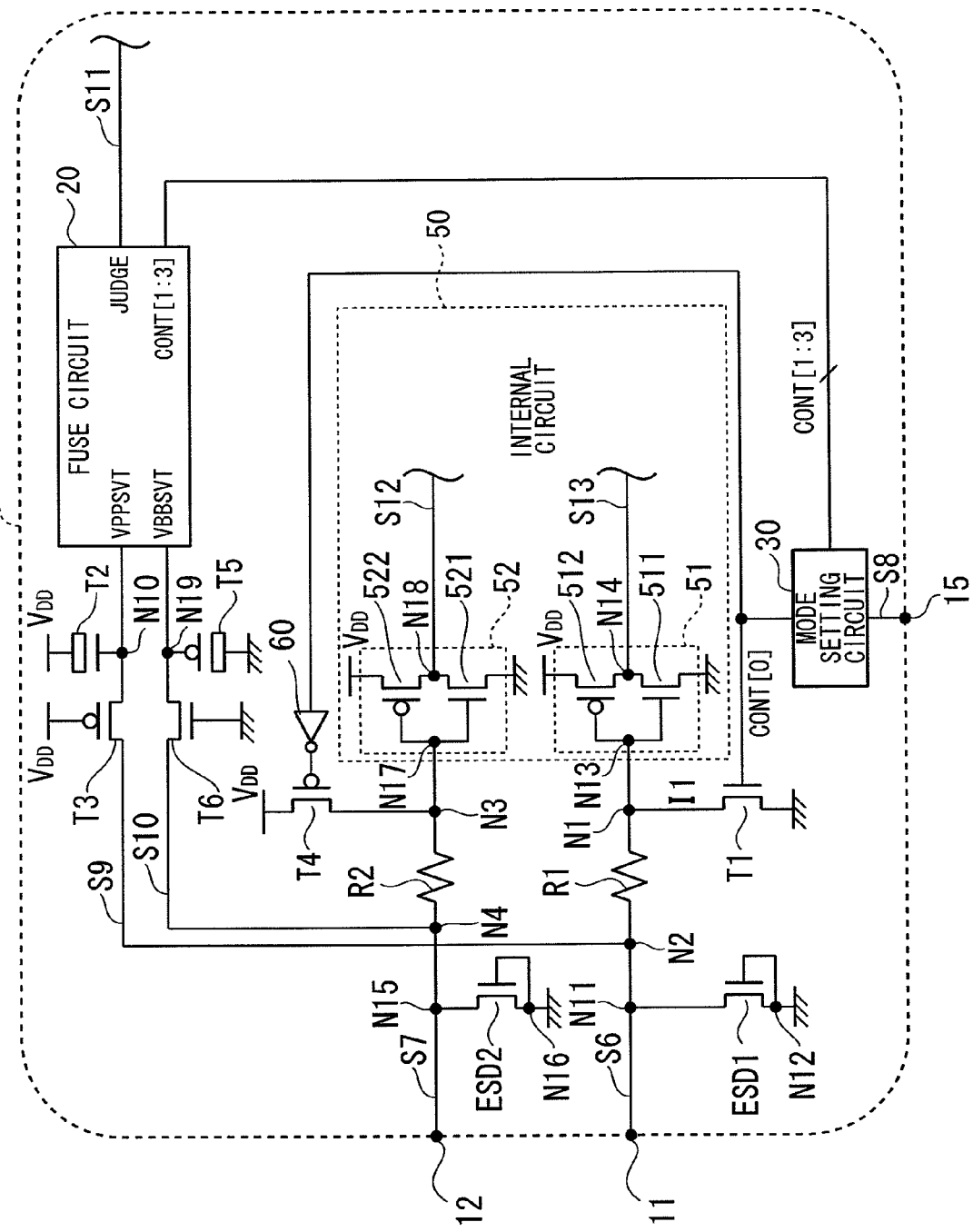
FIG. 5 is a diagram illustrating the configuration of a circuit for a semiconductor device in accordance with a fourth preferred embodiment of the present invention.

FIG. 5 is a diagram illustrating the configuration of a circuit for a semiconductor device 4 in accordance with a fourth preferred embodiment of the present invention. The semiconductor device 4 includes an external terminals 11 and 12, an external mode terminal 15, a fuse circuit 20 (a first circuit), a mode setting circuit 30, an internal circuit 50 (a second circuit), protection elements ESD1 and ESD2, resistive elements R1 and R2, voltage dividers T1 and T4, an inverter element 60, and adjustment capacitors T2 and T5, and switching elements T3 and T6. The voltage divider T4 is coupled to the node N3 which is positioned between the resistive element R2 and the internal circuit 50.

The fuse circuit 20 may include the same configuration as that of the first embodiment. A positive voltage terminal VPPSVT is connected to the external terminals 11 via the switching element T3 at a node N2, a negative voltage terminal VBBSVT is connected to the external terminal 12 via the switching element T6 at a node N4.

The mode setting circuit 30 may include the same configuration as that of the first embodiment. The mode setting circuit 30 transmits a control signal CONT [0] to the voltage divider T1 and the inverter element 60, and transmits control signals CONT [1:3] to the fuse circuit 20. Control signals CONT [0:3] correspond to those described in the first embodiment.

The internal circuit 50 is a circuit which operates at 1.5 V and includes first step circuits 51 and 52. The first step circuit 51 receives a signal S6 from the external terminal 11 via the resistive element R1. The first step circuit 52 receives a signal S7 from the external terminal 12 via the resistive element R2.

The first step circuit 51 includes an N-channel MOS transistor 511 and a P-channel MOS transistor 512. A supply voltage is applied to the source of the P-channel MOS transistor 512, and the drain of the P-channel MOS transistor 512 is coupled to the drain of the N-channel MOS transistor 511 at a node N14. The gates of the N-channel MOS transistor 511 and the P-channel MOS transistor 512 are connected at a node N13 which is connected to one side of the resistive element R1 at a node N1. The source of the N-channel MOS transistor 511 is connected to ground. Thus, the N-channel MOS transistor 511 and the P-channel MOS transistor 512 forms an inverter (inverter 51 or CMOS circuit). The inverter 51 transmits a signal S13 via the node N14, in which the signal S13 is used as an internal signal of the internal circuit 50. Likewise, the first step circuit 52 includes an N-channel MOS transistor 521 and a P-channel MOS transistor 522. A supply voltage is applied to the source of the P-channel MOS transistor 522, and the drain of the P-channel MOS transistor 522 is coupled to the drain of the N-channel MOS transistor 521 at a node N18. The gates of the N-channel MOS transistor 521 and the P-channel MOS transistor 522 are connected at a node N17 which is connected to one side of the resistive element R2 at a node N3. The source of the N-channel MOS transistor 521 is connected to ground. Thus, the N-channel MOS transistor 521 and the P-channel MOS transistor 522 forms an inverter (or inverter 52). The inverter 52 transmits a signal S12 via the node N18, in which the signal S12 is used as an internal signal of the internal circuit 50.

The protection element ESD1 may include an N-channel MOS transistor, in which the source and the gate of the N-channel MOS transistor are coupled at a node N12 and connected to ground. The drain of the N-channel MOS transistor is connected to a node N11 on a wiring which connects the external terminal 11 and one end of the resistive element R1 through the node N2. The one end of the resistive element R1 is connected to the external terminal 11 through the nodes N2 and N11, and the other end of the resistive element R1 is connected to the internal circuit 50 through the node N1.

The protection element ESD2 may include an N-channel MOS transistor, in which the source and the gate of the N-channel MOS transistor are coupled at a node N16 and connected to ground. The drain of the N-channel MOS transistor is connected to a node N15 on a wiring which connects the external terminal 12 and one end of the resistive element R2 through the node N4. The one end of the resistive element R2 is connected to the external terminal 12 through the nodes N4 and N15, and the other end of the resistive element R2 is connected to the internal circuit 50 through the node N3.

The voltage divider T1 may include an N-channel MOS transistor, in which the drain of the N-channel MOS transistor is connected to the node N1 at which the resistive element R1 and the internal circuit 50 are connected. The source of the N-channel MOS transistor is connected to ground, and the gate of the N-channel MOS transistor receives the control signal CONT [0] from the mode setting circuit 30.

The voltage divider T4 may include a P-channel MOS transistor, in which the drain of the P-channel MOS transistor is connected to the node N3 at which the resistive element R2 and the internal circuit 50 are connected. The source of the P-channel MOS transistor is connected to ground, and the gate of the P-channel MOS transistor receives the control signal CONT [0] from the mode setting circuit 30 via the inverter 60.

The adjustment capacitor T2 may include an N-channel MOS transistor. For the N-channel MOS transistor, the source and the drain are coupled each other, and a supply voltage is applied individually to the source and drain. The gate of the N-channel MOS transistor is connected to the positive voltage terminal VPPSVT of a fuse circuit 20 via a node N10 and connected to the external terminal 11 via the node N10 and the node N2.

The adjustment capacitor T5 may include a P-channel MOS transistor. For the P-channel MOS transistor, the source and the drain are coupled each other, and a supply voltage is applied individually to the source and drain. The gate of the P-channel MOS transistor is connected to the negative voltage terminal VBBSVT of a fuse circuit 20 via a node N19 and connected to the external terminal 12 via the node N19 and the node N4.

The switching element T3 may include a P-channel MOS transistor. For the P-channel MOS transistor, a supply voltage is applied to the gate of the P-channel MOS transistor. The drain is connected to one end of a resistive element R1 via the node N2, and the source is connected to the gate of the N-channel MOS transistor of the adjustment capacitor T2 and the positive voltage terminal VPPSVT of the fuse circuit 20 via the node N10.

The switching element T6 may include an N-channel MOS transistor. For the N-channel MOS transistor, the gate of the N-channel MOS transistor is connected to ground. The drain is connected to one end of a resistive element R2 via the node N4, and the source is connected to the gate of the N-channel MOS transistor of the adjustment capacitor T5 and the negative voltage terminal VBBSVT of the fuse circuit 20 via the node N19.

In accordance with the semiconductor device 4 of the present embodiment, an operation of writing date to the fuse circuit 20 is different from the case of the first embodiment. Now the write mode is described below. In order to write data in the fuse circuit 20, a potential difference of 6 V (+3V and −3V) is applied to the positive voltage terminal VPPSVT and negative voltage terminal VBBSVT.

In the same manner as the first embodiment, when the control signals CONT [0:3]=(H, L, H, H), are transmitted to the voltage dividers T1 and T4, the P-channel MOS transistors Q1, Q2, and Q3 of the fuse circuit 20, the voltage dividers T1 and T4 and the P-channel MOS transistor Q1 become a conductive state, and the P-channel MOS transistors Q2 and Q3 become a non-conducing state. Further when the voltage divider T4 receives a signal CONT [0]=(L) from the mode setting circuit 30, then the voltage dividers T1 and T4 become a non-conductive state.

See FIG. 2 and FIG. 5.

When a signal S6 with a voltage higher than the supply voltage, 3 V is applied to the external terminal 11, and a signal S7 with a voltage lower than the ground voltage −3 V is applied to the external terminal 12, the potential difference between the positive voltage terminal VPPSVT and negative voltage terminal VBBSVT becomes 6 V, then the fuse circuit 20 operates. Namely, the gate oxide layer of the electrical fuse 21 is broken, and data are stored in the fuse circuit 20.

In this case, the signal S6 received from the external terminal 11 causes voltage drop by the resistive element R1 and the voltage divider T1, then the signal S6 having lower voltage is received by the individual gates of the N-channel MOS transistor 511 and the P-channel MOS transistor 512. Thereby, even if the signal S6 having a voltage higher than the breakdown voltage of the MOS transistors 511 and 512 is applied to the external terminal 11, the voltage of the signal S5 can be reduced to lower than the break down voltage of the MOS transistors 511 and 512. Further, the signal S7 received from the external terminal 12 causes voltage drop by the resistive element R2 and the voltage divider T4, then the signal S7 having lower voltage is received by the individual gates of the N-channel MOS transistor 521 and the P-channel MOS transistor 522. Thereby, even if the signal S7 having a voltage higher than the breakdown voltage of the MOS transistors 521 and 522 is applied to the external terminal 12, the voltage of the signal S7 can be reduced to lower than the break down voltage of the MOS transistors 521 and 522.

As describe above, for the semiconductor device 4 of the present embodiment, the positive voltage terminal VPPSVT and negative voltage terminal VBBSVT are respectively connected to the external terminals 11 and 12 so that a positive voltage signal and a negative voltage signal can be independently applied to the electrical fuse 21 of the fuse circuit 20. In this manner, although the absolute voltage of the signals to be applied to the external terminals 11 and 12 becomes smaller, it is possible to operate the fuse circuit 20. For example, as the same manner described above, even if the signal S6 having +3 V and the signal S7 having −3 V are applied to the external terminals 11 and 12, respectively, the fuse circuit 20 are applied by an effective voltage of 6 V, so that the fuse circuit 20 can be operated.

As a result, on the write mode, as the signals of the absolute voltages can be reduced for applying the external terminals 11 and 12, the resistances of the resistive elements R1 and R2 used for generating the voltage drop can be smaller. This results in reduction of influence on the operation of the internal circuit 40 on the normal mode because the attenuation of the signals S6 and S7 can be minimized after being received from the external terminals 11 and 12.

Further, the signal S7 having a voltage lower than the ground voltage can be applied to the external terminal 12 for introducing the signal S7 to the first step circuit 52, because the resistive element R2 and the voltage divider T4, which is connected to the external terminal 12, can reduce the absolute voltage of the signal S7.

In the present embodiment, although it is described as an example that the circuit having the resistive element R2 and the voltage divider T4 are used with the circuit having the resistive element R1 and the voltage divider T1, any other combination may be used instead.

Fifth Embodiment

Figure 6:
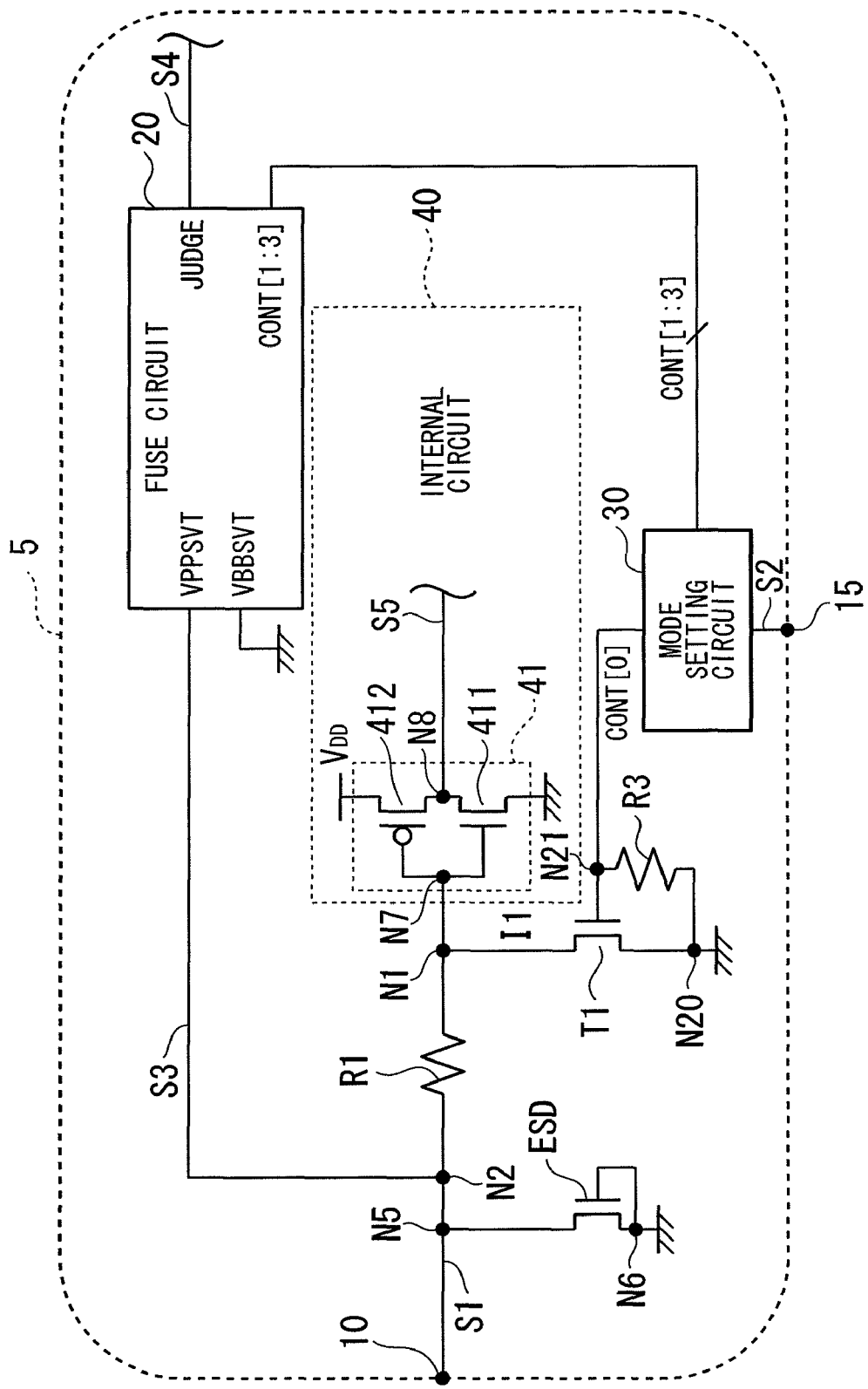
FIG. 6 is a diagram illustrating the configuration of a circuit for a semiconductor device in accordance with a fifth preferred embodiment of the present invention.

FIG. 6 is a diagram illustrating the configuration of a circuit for a semiconductor device 5 in accordance with a fifth preferred embodiment of the present invention. The semiconductor device 5 is another example which modifies the semiconductor device 1 of the first embodiment shown in FIG. 1. The semiconductor device 5 further includes a resistive element R3 which is coupled to the gate of an N-channel MOS transistor of a voltage divider T1 at a node N21 and coupled to the source of the N-channel MOS transistor at a node N20, unlike the case of the semiconductor device 1 of the first embodiment. Since the remaining parts of the semiconductor device 5 except the resistive element R3 are the same as those of the semiconductor device 1 of the first embodiment, the remaining parts corresponding to those of the semiconductor device 1 are indicated by the same symbols (10, 15, 20, 30, 40, 41, 411, 412, ESD, R1, T1, etc.) and the explanations about those parts are omitted.

One end of the resistive element R3 is coupled to the gate of the N-channel MOS transistor of the voltage divider T1 at the node N21 and the other end of the resistive element R3 is coupled to the source of the N-channel MOS transistor at the node N20.

The resistance of the resistive element R3 has a value which allows the N-channel MOS transistor to be a conductive state when a control signal CONT [0] is an H level.

With this configuration, the voltage divider T1 becomes a non-conductive state when the control signal CONT [0] is an L level, which is under a normal operation, then the voltage divider T1 functions similarly to a protection element ESD, so that an internal circuit 40 can be protected from ESD (electrostatic discharge) damage due to electrostatic discharge. Further, the voltage divider T1 becomes the conductive state when the control signal CONT [0] is H level, which is used when data are written in a fuse circuit 20. Thereby, similarly to the case of the first embodiment, the voltage divider T1 and the resistive element R1 can reduce a signal S1 being received from an external terminal 10, and can introduce the reduced signal S1 to the internal circuit 40.

The semiconductor device 5 can protect the internal circuit 40 from ESD damage with the operation of the voltage divider T1 as described above.

From the first embodiment through the fifth embodiment, although it has been described that a first circuit operating at a first voltage which is a high voltage level corresponds to the fuse circuit 20, and a second circuit operating at a second voltage which is lower than the first voltage corresponds to the internal circuit 40 (or 50), the first circuit may include the electrical fuse 21. The first circuit may be any circuit, as long as the first circuit receives the signal from the external terminal 10 (11 or 12) and operates with the first voltage which is higher than the second voltage being the operation voltage of the internal circuit 40 (or 50).

The transistors described in the embodiments may be, but is not limited to, FETs (field effect transistors), or bipolar transistors. Not only FET but also other transistors may be used. Instead of MOS (Metal Oxide Semiconductor) described in the embodiment, it may be, but is not limited to, MIS (Metal-Insulator Semiconductor), and TFT (Thin Film Transistor). Further, N-channel transistors or NMOS transistor are an example of a first conducting type transistor. P-channel transistors or PMOS transistors are an example of a second conducting type transistor. A substrate may be, but not limited to, a P-type semiconductor substrate, an N-type semiconductor substrate, an SOI (Silicon on Insulator) substrate, and any of semiconductor substrates.

Further, the present invention can be applied to most semiconductor apparatuses, such as CPU (Central Processing Unit), MCU (Micro Control Unit), DSP (Digital Signal Processor), ASIC (Application Specific Standard Circuit), DRAM (Dynamic Random Access Memory), SRAM (Static Random Access Memory), non-volatile memories, for example, flush memories, or the like.

The term "configured" is used to describe a component, section or part of a device includes hardware and/or software that is constructed and/or programmed to carry out the desired function.

It is apparent that the present invention is not limited to the above embodiments, but may be modified and changed without departing from the scope and spirit of the invention.

What is claimed is:

1. A semiconductor device comprising:
    a first circuit coupled to a first terminal, the first circuit being operable by a first voltage supplied from the first terminal;
    a second circuit coupled through a first resistive element to the first terminal, the second circuit being operable by a second voltage supplied through the first resistive element from the first terminal, the second voltage being smaller in absolute value than the first voltage; and
    a first voltage dividing circuit coupled to a first node between the first resistive element and the second circuit, the first voltage dividing circuit having a conductive state and a non-conductive state, the first voltage dividing circuit being kept in the conductive state while applying the first voltage to the first terminal to allow the first circuit to operate by the first voltage,
    wherein the second circuit comprises a first transistor including a first gate, and
    the first gate is coupled to the first node.

2. The semiconductor device according to claim 1, wherein the first voltage dividing circuit receives a first control signal that switches the first voltage dividing circuit between the conductive state and the non-conductive state.

3. The semiconductor device according to claim 1, wherein the second circuit comprises a first CMOS circuit having a first input coupled to the first node.

4. The semiconductor device according to claim 1, further comprising:
    a first capacitive element coupled to the first circuit, the first capacitive element being coupled to a second node being between the first terminal and the first resistive element.

5. The semiconductor device according to claim 4, wherein the first capacitive element comprises a MOS capacitor, the MOS capacitor increases capacitance when the first voltage is applied to the first terminal.

6. The semiconductor device according to claim 4, further comprising:
    a first switching element coupled between the second node and the first capacitive element, the first switching element being kept in a conductive state while the first voltage is applied to the first terminal.

7. The semiconductor device according to claim 1, wherein the first circuit comprises an electric fuse.

8. The semiconductor device according to claim 1, wherein the first circuit comprises a memory circuit comprising an electric fuse and field effect transistors.

9. The semiconductor device according to claim 1, wherein the first voltage dividing circuit comprises a field effect transistor coupled between the first node and a fixed-potential line.

10. The semiconductor device according to claim 1, wherein the first circuit is coupled to a second terminal, the first circuit is operable when a difference in potential between the first and second terminals is equal to the first voltage, and
    the second circuit is coupled through a second resistive element to the second terminal.

11. The semiconductor device according to claim 10, further comprising:
    a second voltage dividing circuit coupled to a third node between the second resistive element and the second circuit, the second voltage dividing circuit being kept in a conductive state when the difference in potential between the first and second terminals is equal to the first voltage.

12. The semiconductor device according to claim 11, wherein the second voltage dividing circuit receives a second control signal that switches the second voltage dividing circuit between the conductive state and a non-conductive state.

13. The semiconductor device according to claim 1, further comprising:
    a mode setting circuit that supplies the first voltage dividing circuit with a first control signal that switches the first voltage dividing circuit between the conductive state and a non-conductive state.

14. A semiconductor device comprising:
    an external terminal;
    a non-volatile circuit operable at a first voltage in a writing mode;
    an internal circuit operable at a second voltage that is smaller in absolute value than the first voltage in a normal mode, the internal circuit including a first transistor including a gate coupled to the external terminal; and
    a second transistor coupled between the gate of the first transistor and a first power supply line, the second transistor including a conductive state in the writing mode and a non-conductive state in the normal mode.

15. The semiconductor device according to claim 14, wherein the second transistor receives a control signal that switches the second transistor between the conductive state and the non-conductive state.

16. The semiconductor device according to claim 14, further comprising an ESD circuit coupled between the external terminal and a second power supply line.

17. The semiconductor device according to claim 16, further comprising a resistive element coupled between the gate of the first transistor and the external terminal.

18. The semiconductor device according to claim 14, further comprising a mode setting circuit generating a control signal supplied to a gate of the second transistor in response to a mode signal.

19. The semiconductor device according to claim 14, further comprising a third transistor including a gate coupled to the gate of the first transistor, a conductivity type of the third transistor being different from the first transistor.

* * * * *